United States Patent
Yune

(10) Patent No.: US 9,653,474 B2
(45) Date of Patent: May 16, 2017

(54) ELECTRONIC DEVICE AND METHOD FOR FABRICATING THE SAME

(71) Applicant: SK hynix Inc., Icheon-si, Gyeonggi-do (KR)

(72) Inventor: Hyoung-Soon Yune, Icheon-si (KR)

(73) Assignee: SK hynix Inc., Icheon-si (KR)

(*) Notice: Subject to any disclaimer, the term of this patent is extended or adjusted under 35 U.S.C. 154(b) by 3 days.

(21) Appl. No.: 14/880,656

(22) Filed: Oct. 12, 2015

(65) Prior Publication Data
US 2016/0343726 A1 Nov. 24, 2016

(30) Foreign Application Priority Data
May 22, 2015 (KR) .................. 10-2015-0071716

(51) Int. Cl.
*G06F 12/08* (2016.01)
*H01L 27/11582* (2017.01)
*H01L 27/11568* (2017.01)
*G06F 3/06* (2006.01)

(52) U.S. Cl.
CPC ...... *H01L 27/11582* (2013.01); *G06F 3/0604* (2013.01); *G06F 3/0656* (2013.01); *G06F 3/0658* (2013.01); *G06F 3/0659* (2013.01); *G06F 3/0679* (2013.01); *G06F 12/08* (2013.01); *H01L 27/11568* (2013.01); *G06F 2212/214* (2013.01); *G06F 2212/281* (2013.01); *G06F 2212/313* (2013.01)

(58) Field of Classification Search
CPC ......... H01L 27/11582; H01L 27/11568; G06F 3/0604; G06F 3/0656; G06F 3/0658; G06F 3/0659; G06F 3/0679; G06F 12/08
USPC ..... 711/102, 103; 365/185.33; 257/324, 750
See application file for complete search history.

(56) References Cited

U.S. PATENT DOCUMENTS

| 8,513,729 | B2* | 8/2013 | Choe | G11C 16/0483 257/324 |
| 9,006,903 | B2* | 4/2015 | Lee | H01L 29/7926 257/751 |
| 9,012,974 | B2* | 4/2015 | Chae | H01L 27/11582 257/324 |
| 9,324,731 | B1* | 4/2016 | Lai | H01L 27/11565 |
| 9,472,569 | B2* | 10/2016 | Lee | H01L 27/11582 |

(Continued)

FOREIGN PATENT DOCUMENTS

KR 1020110120536 A 11/2011

*Primary Examiner* — Stephen Elmore
(74) *Attorney, Agent, or Firm* — William Park & Associates Ltd.

(57) ABSTRACT

A method for fabricating an electronic device including a semiconductor memory may include: forming a stack structure in which an interlayer dielectric layer and a material layer are alternately stacked on a substrate; forming a plurality of holes arranged to have a substantially constant interval while exposing the substrate by passing through the stack structure; forming a channel layer in a first hole of the plurality of holes; forming a dummy layer in a second hole of the plurality of holes; forming a mask pattern on a resultant structure including the dummy layer and the channel layer to expose an area extending in a first direction while overlapping the dummy layer arranged in the first direction; and forming a slit by etching the stack structure using the mask pattern as an etching barrier and removing the dummy layer.

27 Claims, 16 Drawing Sheets

(56) References Cited

U.S. PATENT DOCUMENTS

| | | | | |
|---|---|---|---|---|
| 2013/0301350 A1* | 11/2013 | Choe | ................. | G11C 16/0483 365/184 |
| 2013/0309849 A1* | 11/2013 | Jung | ................ | H01L 29/66833 438/479 |
| 2015/0287739 A1* | 10/2015 | Lee | .................. | H01L 27/11575 257/326 |

* cited by examiner

ELECTRONIC DEVICE AND METHOD FOR FABRICATING THE SAME

CROSS-REFERENCE TO RELATED APPLICATIONS

The present application claims priority of Korean Patent Application No. 10-2015-0071716, filed on May 22, 2015, which is incorporated herein by reference in its entirety.

BACKGROUND

1. Technical Field

Exemplary embodiments of the present disclosure generally relate to a semiconductor device, and more particularly, to an electronic device including a plurality of memory cells vertically stacked from a substrate and a method for fabricating the same.

2. Related Art

A semiconductor device capable of storing data and substantially maintaining the stored data even though a power supply to the semiconductor device is interrupted may include, for example, a NAND type flash and the like.

Two-dimensional semiconductor devices having memory cells formed in a single layer on a silicon substrate are reaching an integration degree limit. Recently, a three-dimensional semiconductor device having a plurality of memory cells vertically stacked from a silicon substrate has been proposed.

SUMMARY

In an embodiment, a method for fabricating an electronic device including a semiconductor memory is provided. The method may include: forming a stack structure in which an interlayer dielectric layer and a material layer are alternately stacked on a substrate; forming a plurality of holes arranged to have a substantially constant interval while exposing the substrate by passing through the stack structure; forming a channel layer in a first hole of the plurality of holes; forming a dummy layer in a second hole of the plurality of holes; forming a mask pattern on a resultant structure including the dummy layer and the channel layer to expose an area extending in a first direction while overlapping the dummy layer arranged in the first direction; and forming a slit by etching the stack structure using the mask pattern as an etching barrier and removing the dummy layer.

In an embodiment, an electronic device including a semiconductor memory may be provided. The semiconductor memory may include: a plurality of channel layers extending in a vertical direction from a substrate; an interlayer dielectric layer and a gate electrode layer alternately stacked on the substrate along the channel layer; a memory layer interposed between the channel layer and the gate electrode layer; and a slit formed in a stack structure of the interlayer dielectric layer and the gate electrode layer and extending in a first direction. The slit may include convex parts having a relatively larger width in a second direction crossing the first direction than concave parts having a relatively smaller width in the second direction.

an embodiment, an electronic device including a semiconductor memory may be provided. The semiconductor memory may include: a plurality of channel layers extending in a vertical direction from a substrate; an interlayer dielectric layer and a gate electrode layer alternately stacked on the substrate along the channel layer; a memory layer interposed between the channel layer and the gate electrode layer; and a slit formed in a stack structure of the interlayer dielectric layer and the gate electrode layer and extending in a first direction. The slit may include first convex parts mirrored with second convex parts located across from the first convex parts, respectively. The slit may include first concave parts mirrored with second concave parts located across form the second concave parts, respectively.

DETAILED DESCRIPTION

Figure 1A:
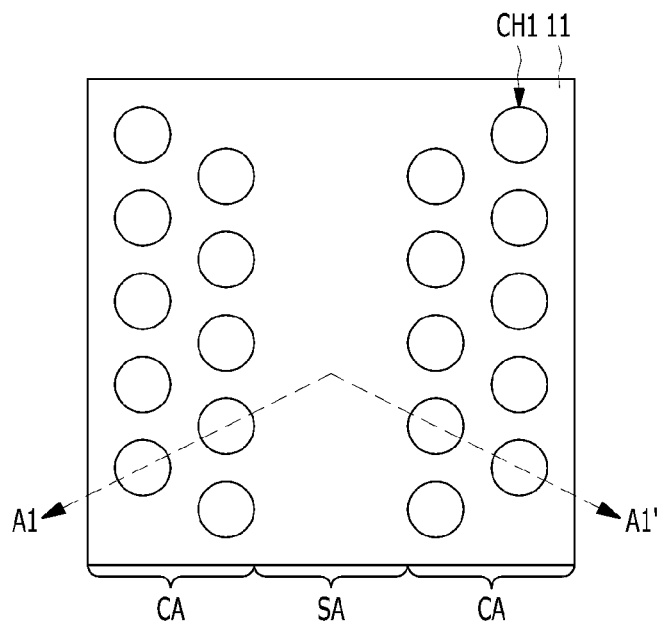
FIG. 1A, FIG. 1B, FIG. 2A, FIG. 2B, FIG. 2C, FIG. 3A, FIG. 3B, FIG. 4A, FIG. 4B, FIG. 5, and FIG. 6 are diagrams for explaining a semiconductor device of a comparison example, a method for fabricating the same, and problems thereof.

Various embodiments will be described below with reference to the accompanying drawings. The embodiments may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments.

Problems occurring when a semiconductor device of a comparison example is fabricated will be firstly described.

Figure 3A:
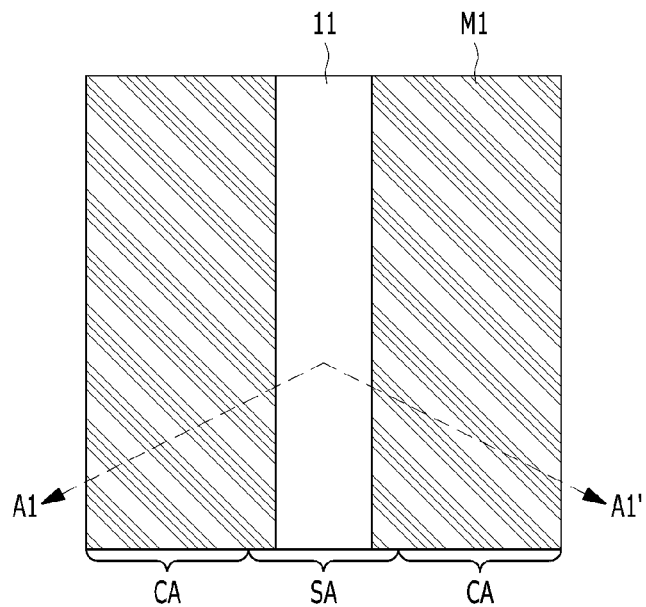
Figure 3B:
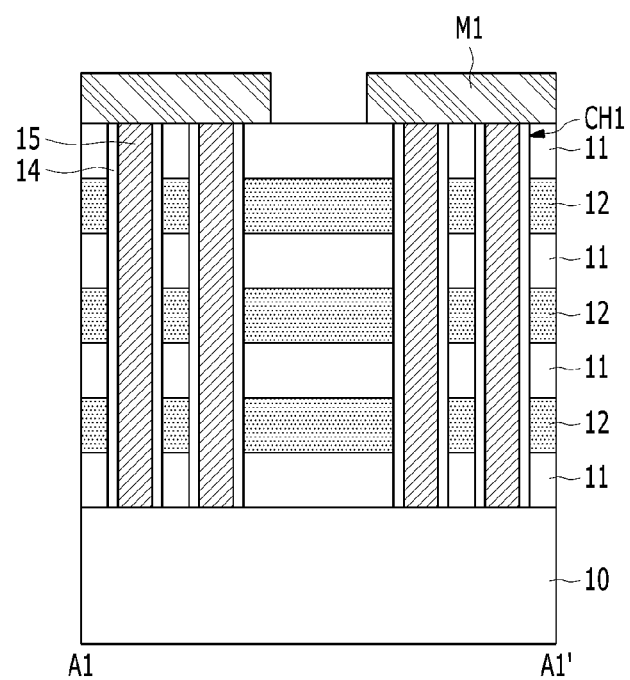
Figure 4A:
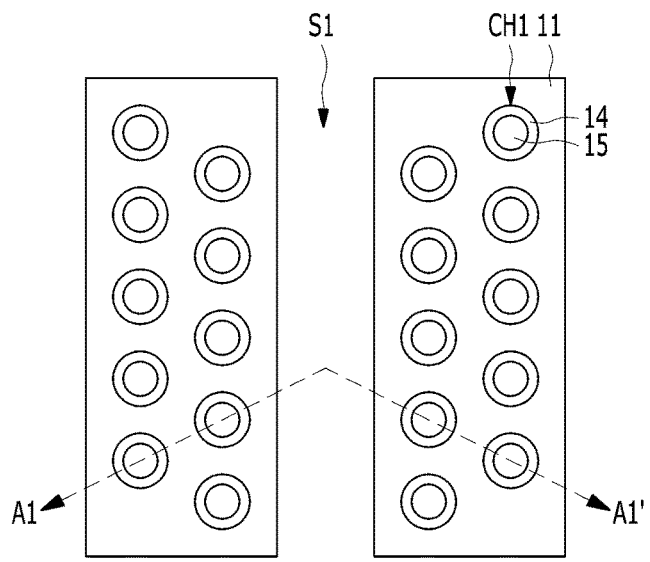
Figure 4B:
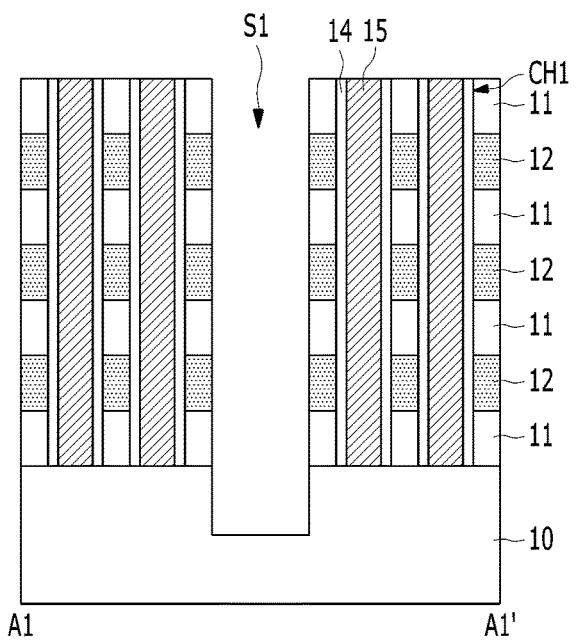
Figure 5:
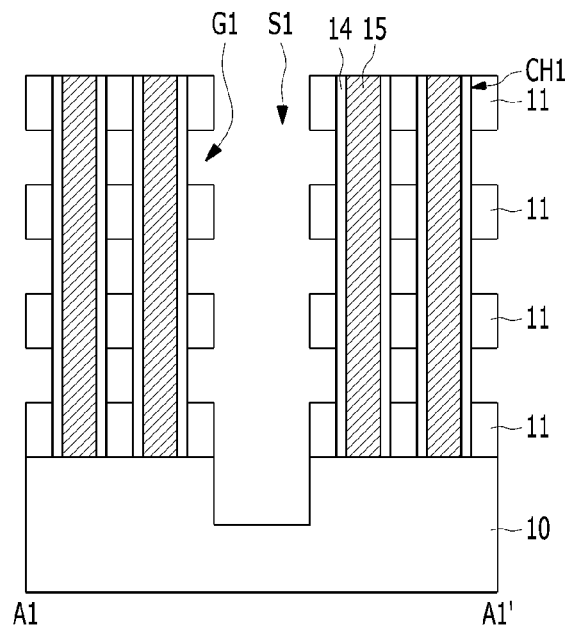
Figure 6:
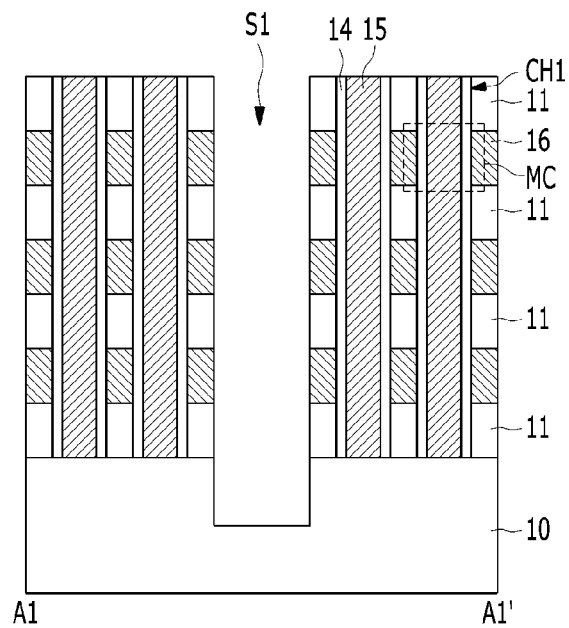

FIG. 1A, FIG. 1B, FIG. 2A, FIG. 2B, FIG. 2C, FIG. 3A, FIG. 3B, FIG. 4A, FIG. 4B, FIG. 5, and FIG. 6 are diagrams for explaining a semiconductor device of a comparison example, a method for fabricating the same, and problems thereof. FIG. 1A, FIG. 2A, FIG. 3A, and FIG. 4A are plan views, and FIG. 1B, FIG. 2B, FIG. 3B, and FIG. 4B are sectional views taken along lines A1-A1' of FIG. 1A, FIG. 2A, FIG. 3A, and FIG. 4A. FIG. 5 and FIG. 6 are sectional views for explaining subsequent processes of FIG. 4A and FIG. 4B.

Figure 1B:
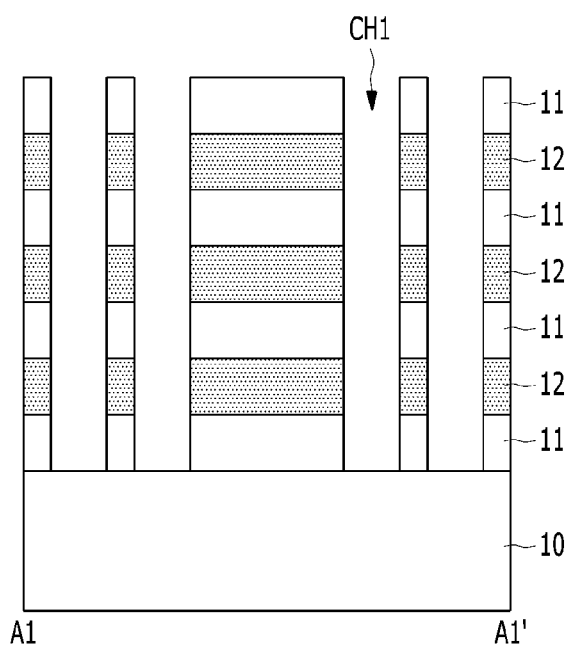

Referring to FIG. 1A and FIG. 1B, a plurality of interlayer dielectric layers 11 and a plurality of sacrificial layers 12 may be alternately stacked on a substrate 10 in which a predetermined lower structure has been formed.

The alternate stack structure of the interlayer dielectric layers 11 and the sacrificial layers 12 may be selectively etched, thereby forming channel holes CH1 for exposing a part of substrate 10 by passing through the alternate stack structure. The channel hole CH1 may be formed except for an area in which a slit is to be arranged. Hereinafter, the area in which the slit is arranged will be referred to as a slit area SA, and an area in which the channel hole CH1 is arranged will be referred to as a channel area CA. In the channel area CA, the channel holes CH1 may be arranged in a zigzag type. On a line A1-A1', an interval between adjacent channel holes CH1 while interposing the slit area SA therebetween may be significantly larger than an interval between adjacent channel holes CH1 included in any one channel area CA.

Figure 2A:
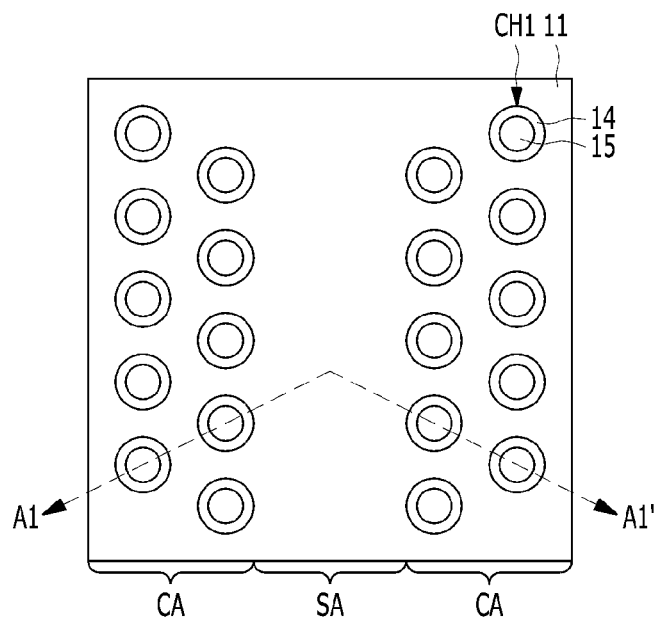
Figure 2B:
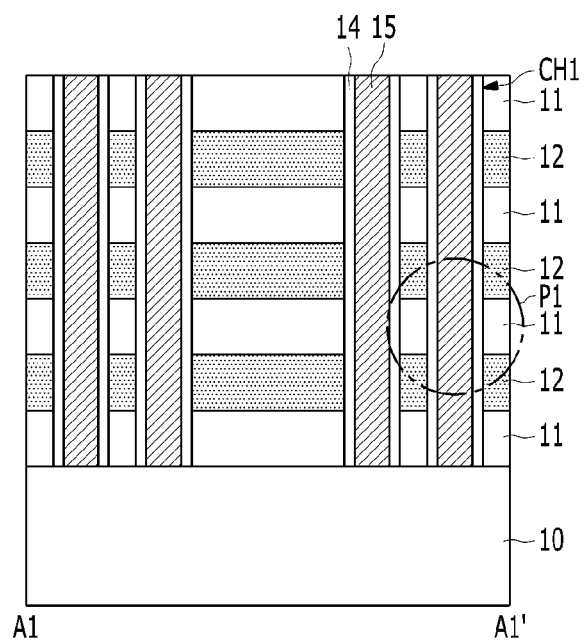
Figure 2C:
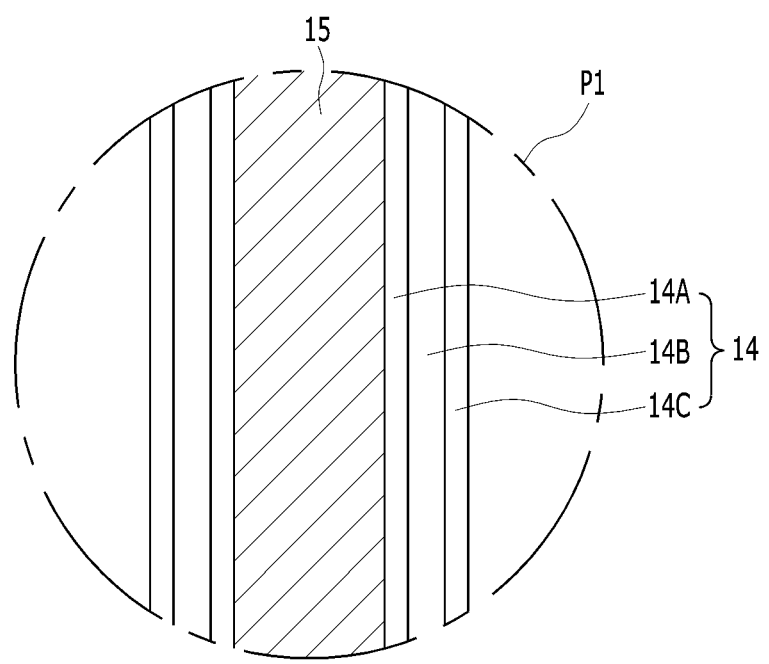

Referring to FIG. 2A and FIG. 2B, a memory layer 14 may be formed on a sidewall of the channel hole CH1, and then a channel layer 15 may be formed to fill the channel hole CH1 in which memory layer 14 has been formed. Referring to FIG. 2C obtained by enlarging a part P1 of FIG. 2B, the memory layer 14 may include a tunnel insulating layer 14A, a charge storage layer 14B, and a charge blocking layer 14C sequentially arranged in an order near the channel layer 15.

Referring to FIG. 3A and FIG. 3B, a mask pattern M1 for forming a slit may be formed on the structure of FIG. 2A and FIG. 2B. The mask pattern M1 may expose only the area in which the slit is to be formed and cover the other area. The slit may be positioned in the slit area SA.

Referring to FIG. 4A and FIG. 4B, the alternate stack structure of the interlayer dielectric layers 11 and the sacrificial layers 12 may be etched by employing the mask pattern M1 of FIG. 3A and FIG. 3B as an etching barrier, thereby forming a slit S1 extending in a first direction. By the slit S1, the alternate stack structure may be divided into two parts in a second direction crossing the first direction. When the slit S1 is formed, a part of the substrate 10 may also be etched by over-etching.

The mask pattern M1 may be removed in an etching process for forming the slit S1 or may be removed through a separate process.

Referring to FIG. 5, the sacrificial layers 12 exposed by the slit S1 may be removed. A space formed by removing the sacrificial layers 12 will be hereinafter referred to as a groove G1. The groove G1 may be formed to surround the channel layer 15 while being positioned between interlayer dielectric layers 11 adjacent in a vertical direction vertical to the surface of the substrate 10.

Referring to FIG. 6, a gate electrode layer 16 may be formed to be filled in the groove G1. The gate electrode layer 16 may be formed in such a manner that a conductive material is deposited along the process resultant of FIG. 5 and an etching process is performed such that the conductive material exists in the groove G1.

As a consequence, a semiconductor device illustrated in FIG. 6 may be fabricated. In this semiconductor device, one memory cell MC may include one channel layer 15, one gate electrode layer 16 surrounding the channel layer 15, and the memory layer 14 interposed therebetween. Charge may be introduced from the channel layer 15 to the charge storage layer 14B or the charge of the charge storage layer 14B may be discharged to the channel layer 15 according to a voltage applied to the gate electrode layer 16, so that different type of data may be stored in the memory cell MC.

However, in accordance with the semiconductor device of the comparison example and the method for fabricating the same, the following problems may occur.

For example, the channel holes CH1 and the channel layer 15 are regularly arranged in the channel area CA, but the regularity of such an arrangement is broken by the slit area SA. Therefore, planar shapes of a channel holes CH1 and a channel layer 15 adjacent to the slit area SA are distorted. In such a case, due to non-uniform loss and the like of the conductive material in a process of filling and etching the conductive material in the groove G1 in order to form the gate electrode layer 16, a non-uniform gate electrode layer 16 may be formed. As a consequence, the characteristics of the memory cell MC may not be uniform in the comparison example.

In addition, in the second direction, the width of the slit S1 of a predetermined level or more should be ensured. Only when the width of the slit S1 is increased to the predetermined level or more, the separation of the stack structure by the slit S1 may be easy, and the removal process of the sacrificial layers 12 through the slit S1 and the formation process of the gate electrode layer 16 may be easily performed. However, when the width of the slit S1 is increased, the area of the semiconductor device may increase in the comparison example.

In the present embodiments, the problems of the aforementioned comparison example may be solved, thereby providing semiconductor devices and methods for fabricating the same, by which it may be possible to ensure uniform memory cell characteristics and reduce an area thereof.

Figure 9A:
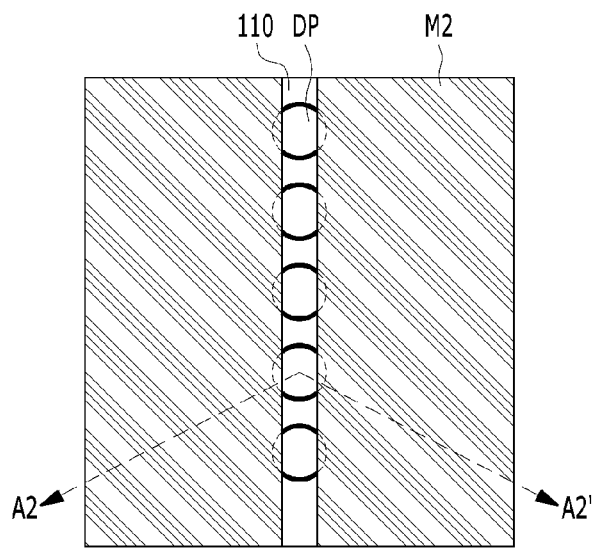
Figure 9B:
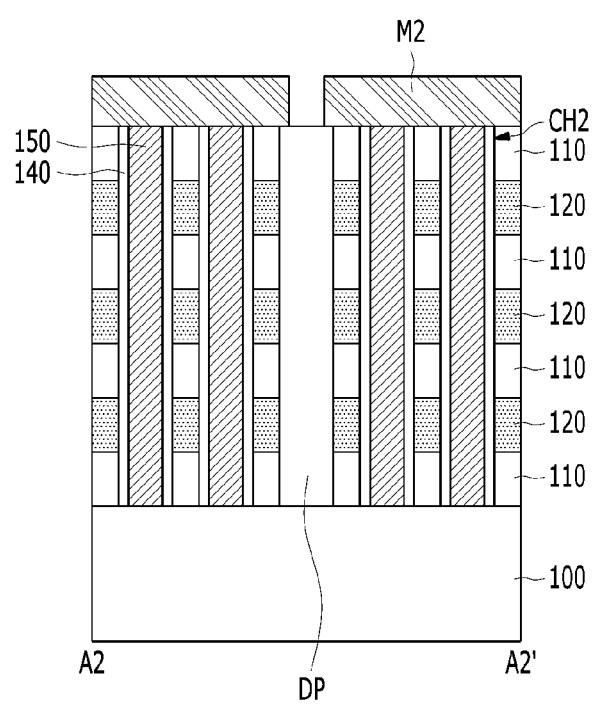
Figure 10A:
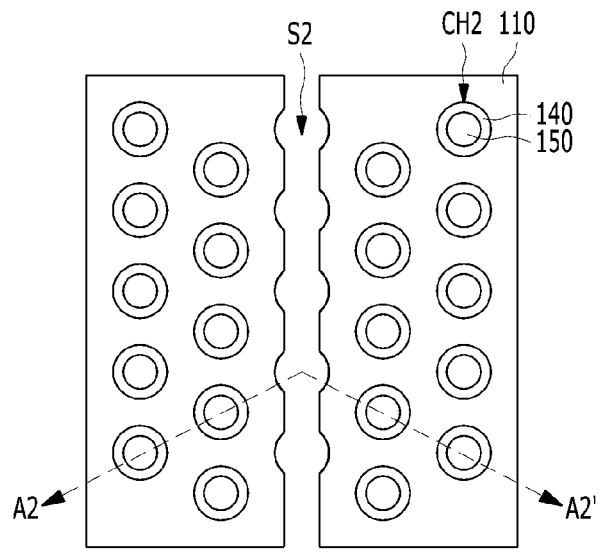
Figure 10B:
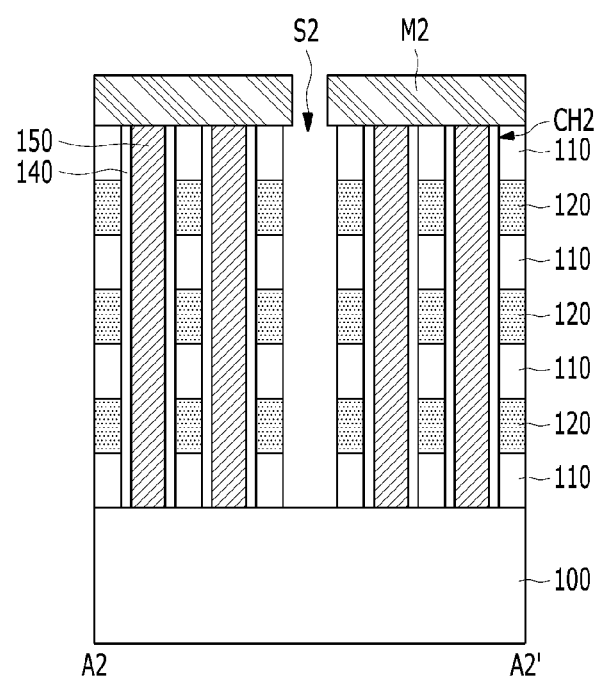
Figure 11:
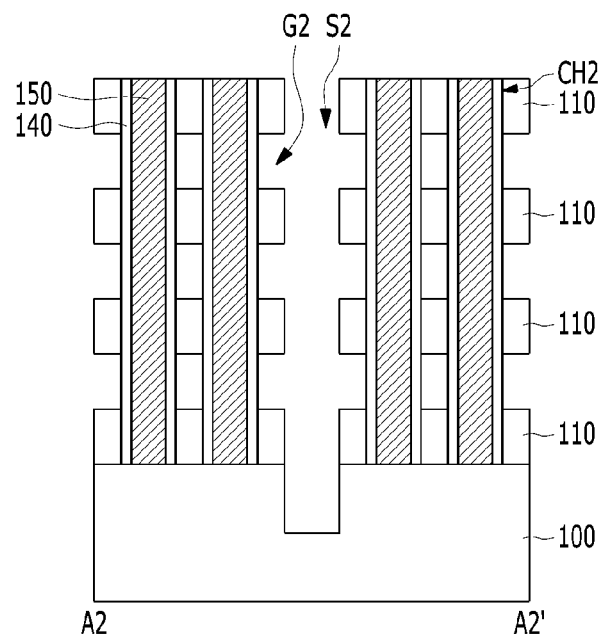
Figure 12:
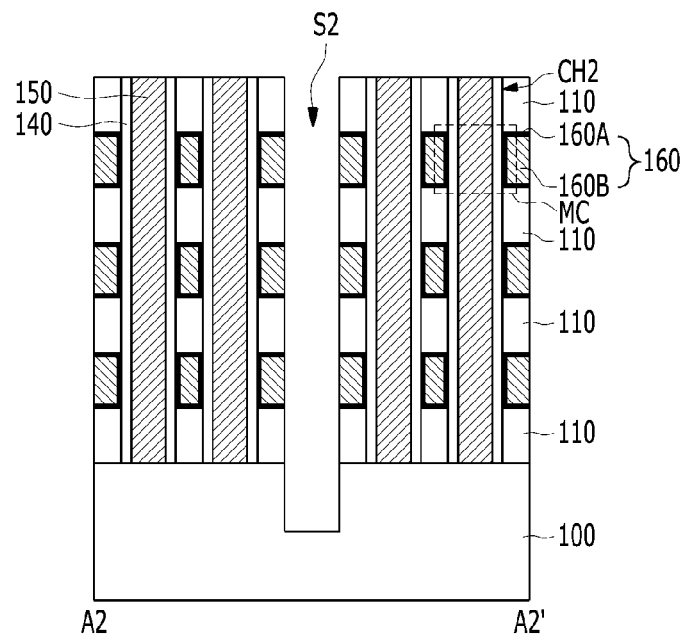

FIG. 7A, FIG. 7B, FIG. 8A, FIG. 8B, FIG. 8C, FIG. 9A, FIG. 9B, FIG. 10A, FIG. 10B, FIG. 11, and FIG. 12 are diagrams illustrating representation of examples for explaining semiconductor devices and methods for fabricating the same in accordance with various embodiments. FIG. 7A, FIG. 8A, FIG. 9A, and FIG. 10A are plan views, and FIG. 7B, FIG. 8B, FIG. 9B, and FIG. 10B are sectional views taken along lines A1-A1' of FIG. 7A, FIG. 8A, FIG. 9A, and FIG. 10A. FIG. 11 and FIG. 12 are sectional views for explaining subsequent processes of FIG. 10A and FIG. 10B.

The various embodiments may be directed to an electronic device capable of ensuring uniformity of memory cell characteristics and enabling size reduction and process simplification and a method for fabricating the same.

Figure 7A:
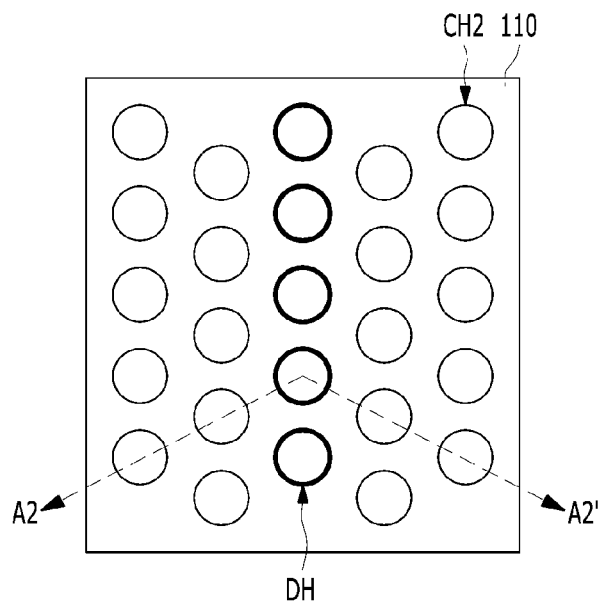
FIG. 7A, FIG. 7B, FIG. 8A, FIG. 8B, FIG. 8C, FIG. 9A, FIG. 9B, FIG. 10A, FIG. 10B, FIG. 11, and FIG. 12 are diagrams illustrating representations of examples for explaining semiconductor devices and methods for fabricating the same in accordance with various embodiments.
Figure 7B:
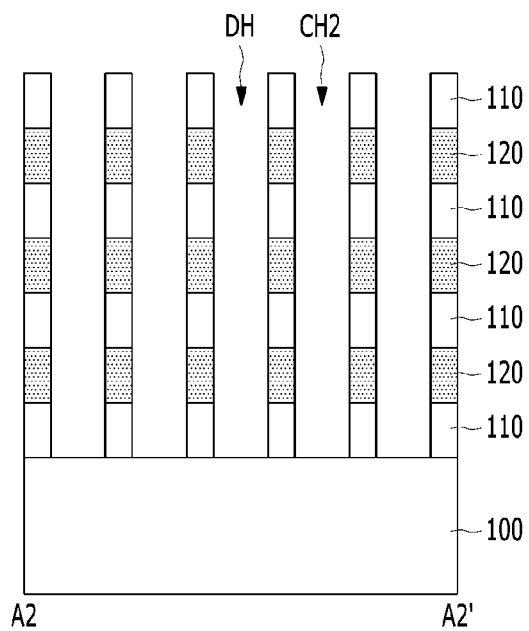

Referring to FIG. 7A and FIG. 7B, a substrate 100, in which a predetermined lower structure (not illustrated) has been formed, may be provided. For example, the substrate 100 may include a source region to be coupled to a channel layer. Alternatively, the substrate 100 may include a coupling member which may be coupled to a pair of channel layers to couple them to each other.

On the substrate 100, a plurality of interlayer dielectric layers 110 and a plurality of sacrificial layers 120 may be alternately stacked. The sacrificial layer 120 may be replaced with a gate electrode of the memory cell in a subsequent process, and may be formed of a material having an etch rate different from that of the interlayer dielectric layer 110. This is, for substantially preventing the interlayer dielectric layer 110 from being damaged in a subsequent removal process of the sacrificial layer 120. For example, when the interlayer dielectric layer 110 is formed of silicon oxide, the sacrificial layer 120 may be formed of silicon nitride. The interlayer dielectric layer 110 is for insulating gate electrodes of memory cells vertically positioned from each other, and may be formed of various insulating materials such as silicon oxide, silicon nitride, silicon oxide nitride, and a combination thereof.

The alternately stacked structure of the interlayer dielectric layers 110 and the sacrificial layers 120 may be selectively etched, thereby forming channel holes CH2 and dummy holes DH for exposing a part of the substrate 100 by passing through the alternate stack structure. The channel hole CH2 is for providing a space in which a channel is to be formed, and may be arranged in a channel area. In the channel area, the channel holes CH2 may be arranged in a zigzag type. The dummy hole DH is a hole having no relation to the channel, and may be formed in an area except for the channel area. The dummy hole DH may have planar and sectional shapes substantially the same as those of the channel hole CH2, and may be formed to be regularly arranged with the channel hole CH2. For example, the dummy holes DH and the channel holes CH2 may be arranged in a zigzag type. The zigzag type may indicate that the holes are arranged to be positioned on a straight line in a first direction, but are not positioned on the straight line in a second direction substantially vertical to the first direction and are arranged to cross one another. An interval between two adjacent channel holes CH2 may be substantially the same as that of adjacent channel hole CH2 and dummy hole DH. The channel hole CH2 and the dummy hole DH may be formed in substantially the same mask and etching processes. In an embodiment, two channel holes CH2 and one dummy hole DH are alternately arranged on a line A2-A2'; however, the embodiments are not limited thereto. In an embodiment, three or more channel holes CH2 and one dummy hole DH may also be alternately arranged, etc. In an embodiment, one or more channel holes CH2 and one or more dummy holes DH may also be alternately arranged.

Figure 8A:
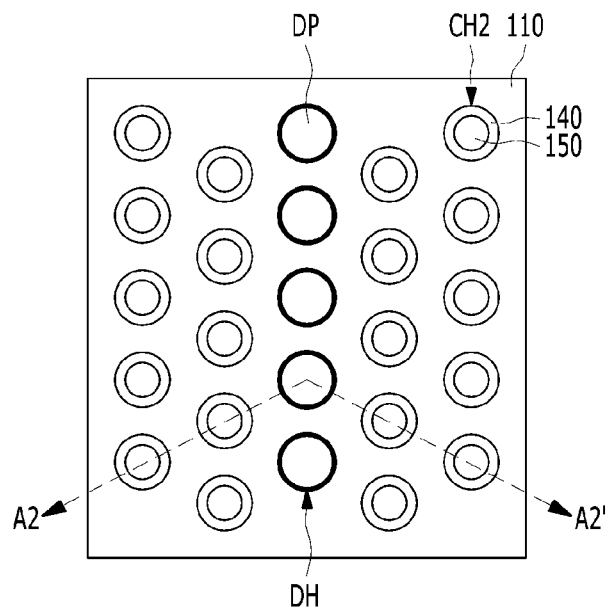
Figure 8B:
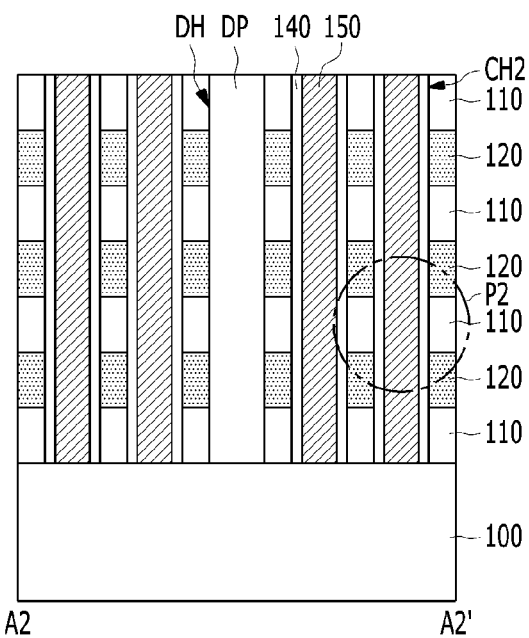

Referring to FIG. 8A and FIG. 8B, a dummy layer DP may be formed to be filled in the dummy hole DH. The dummy layer DP may be formed of substantially the same material as that of the interlayer dielectric layers 110 or the sacrificial layers 120. In such an example, at the time of a subsequent slit process, in a process of etching the alternate stack structure of the interlayer dielectric layers 110 and the sacrificial layers 120, the dummy layer DP may also be removed, resulting in process simplification. The dummy layer DP may be formed in the state in which a mask pattern (not illustrated) for covering the channel area has been formed.

Figure 8C:
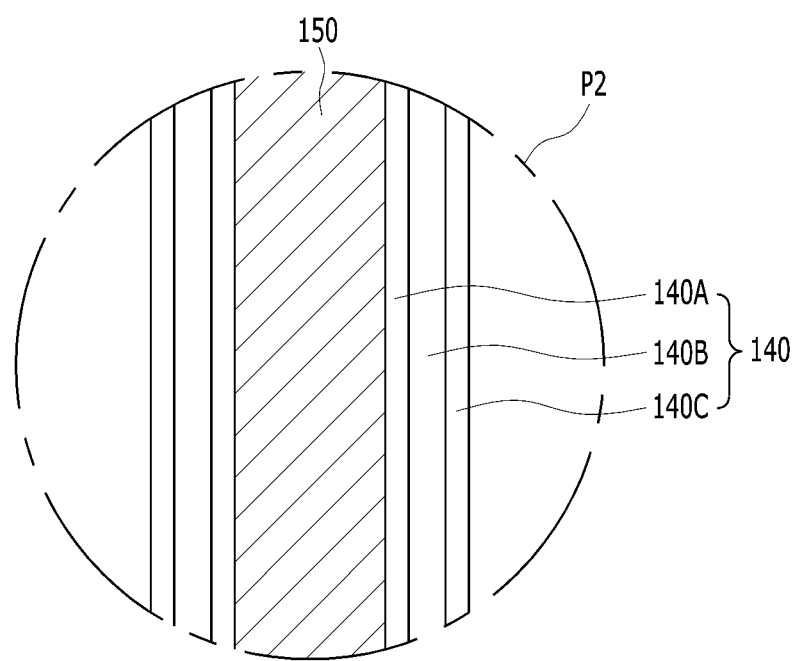

A memory layer 140 may be formed on a sidewall of the channel hole CH2 and then a channel layer 150 may be formed to be filled in the channel hole CH2 in which the memory layer 140 has been formed. Referring to FIG. 8C obtained by enlarging a part P2 of FIG. 8B, the memory layer 140 may include a tunnel insulating layer 140A, a charge storage layer 140B, and a charge blocking layer 140C sequentially arranged in an order near the channel layer 150. The tunnel insulating layer 140A enables tunneling of a charge and may be formed of silicon oxide and the like. The charge storage layer 140B stores charge and may be formed of silicon nitride, polysilicon and the like. The charge blocking layer 140C blocks transfer of charge and may be formed of silicon oxide and the like. The memory layer 140 may be formed by sequentially depositing the charge blocking layer 140C, the charge storage layer 140B, and the tunnel insulating layer 140A along an entire surface of a resultant structure including the channel hole CH2 and then performing blanket etching. The channel layer 150 may be formed of various semiconductor materials such as polysilicon. The channel layer 150 may be formed by forming a semiconductor material having a thickness for sufficiently filling the channel hole CH2 in which the memory layer 140 has been formed, and then performing a planarization process, for example, CMP (Chemical Mechanical Polishing), until the uppermost interlayer dielectric layers 110 is exposed.

In the above embodiment, the example in which the dummy layer DP is formed in the dummy hole DH and then the memory layer 140 and the channel layer 150 are formed in the channel hole CH2 has been described; however, the various embodiments not limited thereto. In an embodiment, the process of forming the memory layer 140 and the channel layer 150 in the channel hole CH2 may be firstly performed, and then the process of forming the dummy layer DP in the dummy hole DH may be performed.

Referring to FIG. 9A and FIG. 9B, a mask pattern M2 may be formed on the structure of FIG. 8A and FIG. 8B to expose an area in which a slit is to be formed and to cover the other area. The mask pattern may be formed on the structure of FIG. 8A and FIG. 8B including the dummy layer and the channel layer to expose an area extending in a first direction while the mask pattern overlaps part of the dummy layer arranged in the first direction. The area exposed by the mask pattern M2 may have a line shape extending in the first direction while overlapping the dummy layer DP arranged in the first direction. In the second direction crossing the first direction, a width of the area exposed by the mask pattern M2 may be smaller than that of the dummy layer DP. Accordingly, in the second direction, only a center part of the dummy layer DP may be exposed by the mask pattern M2 and both edges of the dummy layer DP may not be exposed.

Referring to FIG. 10A and FIG. 10B, the alternate stack structure of the interlayer dielectric layers 110 and the sacrificial layers 120 may be etched by employing the mask pattern M2 of FIG. 9A and FIG. 9B as an etching barrier and the dummy layer DP may be removed, thereby forming a slit S2 extending in the first direction. In the example in which the dummy layer DP is formed of substantially the same material as that of the interlayer dielectric layer 110 or the sacrificial layer 120, the dummy layer DP may also be removed when the alternate stack structure of the interlayer dielectric layers 110 and the sacrificial layers 120 is etched. However, in the example in which the dummy layer DP is formed of a material different from those of the interlayer dielectric layer 110 and the sacrificial layer 120, an additional removal process of the dummy layer DP may also be performed. As a consequence, the slit S2 may have a planar shape in which a width of the second direction is relatively large at the part at which the dummy layer DP has been positioned and is relatively smaller in the other parts. That is, when viewed from the plan view, the planar slit S2 may have a shape in which convex parts and concave parts are alternately arranged along the first direction.

By this slit S2, the alternate stack structure may be divided into two parts in the second direction. When the slit S2 is formed, a part of the substrate 100 may also be etched by over-etching.

The mask pattern M2 may be removed in an etching process for forming the slit S2 or may be removed through a separate process. In an embodiment, the etching of the stack structure for forming the slit S2 and the removal of the mask pattern M2 are performed simultaneously.

Referring to FIG. 11, the sacrificial layers 120 exposed by the slit S2 may be removed by isotropic etching such as, for example, wet etching. A space formed by removing the sacrificial layers 120 will be hereinafter referred to as a groove G2. The groove G2 may be formed to surround the channel layer 150 while being positioned between interlayer dielectric layers 110 vertically adjacent in a vertical direction.

Referring to FIG. 12, a gate electrode layer 160 may be formed to be filled in the groove G2. The gate electrode layer 160 may be formed in such a manner that a conductive material is deposited along the process resultant of FIG. 11 and a blanket etching process is performed such that the conductive material exists in the groove G2. In an embodiment, the gate electrode layer 160 may include a metal nitride layer 160A of TiN and the like and a metal layer 160B of W (tungsten) and the like. The metal nitride layer 160A may be formed along an inner surface of the groove G2 and may serve as a diffusion barrier of a metal. The metal layer 160B may be formed to fill a remaining space of the groove G2 in which the metal nitride layer 160A has been formed.

By the aforementioned processes, a semiconductor device illustrated in FIG. 12 may be fabricated.

Referring again to FIG. 12, the semiconductor device in accordance with an embodiment may include the columnar channel layer 150 extending in the vertical direction on the substrate 100, the interlayer dielectric layers 110 and the gate electrode layer 160 alternately stacked on the substrate 100 along the channel layer 150, and the memory layer 140 interposed between the channel layer 150 and the gate electrode layer 160. One channel layer 150, one gate electrode layer 160 surrounding the channel layer 150, and the memory layer 140 interposed therebetween may form one memory cell MC. Charge may be introduced from the channel layer 150 to the charge storage layer 140B or the charge of the charge storage layer 140B may be discharged to the channel layer 150 according to a voltage applied to the gate electrode layer 160, so that different type of data may be stored in the memory cell MC.

Referring to FIG. 10A together with FIG. 12, the alternate stack structure of the interlayer dielectric layers 110 and the gate electrode layer 160 may be divided into a plurality of structures by the slit S2 formed in an area in which the channel layer 150 is not arranged. When viewed from the plan view, the slit S2 may have a shape in which convex parts extending in the first direction and having a relatively large width of the second direction and concave parts having a relatively small width of the second direction are alternately arranged. In the present embodiment, in the first direction, the concave parts of the slit S2 may be formed at positions respectively corresponding to adjacent channel layers 150, and the convex parts of the slit S2 may be formed at positions respectively corresponding to corresponding areas between the adjacent channel layers 150. In an embodiment, when viewed from the plan view, the concave parts of the slit S2 may include a first convex part mirrored with respect to the first direction and spaced apart with respect to the second direction from a second convex part. The first convex part across from the second convex part. In an embodiment, when viewed from the plan view, the concave parts of the slit S2 may include a first concave part mirrored with respect to the first direction and spaced apart with respect to the second direction from a second concave part. The first concave part across from the second concave part. In an embodiment, the slit S2 includes first convex parts mirrored with second convex parts located across from the first convex parts in the second direction. In an embodiment, the slit S2 includes first concave parts mirrored with second concave parts located across form the first concave parts in the second direction.

According to the semiconductor device and the method for fabricating the same as described above, the following advantages may be acquired.

When the channel hole CH2 is formed, the dummy hole DH forming a regular arrangement with the channel hole CH2 is formed, so that it is possible to substantially prevent the planar shapes of the channel hole CH2 and the channel layer 150 from being distorted. Accordingly, it may be possible to solve a problem of a defect due to the distortion of the channel hole CH2 and the channel layer 150, for example, non-uniform conductive material loss and the like. As a consequence, the characteristics of the memory cell MC may be uniform.

Furthermore, since the process of forming the slit S2 includes the process of removing the dummy layer DP, it may be possible to easily separate the stack structure regardless of the width of the slit S2.

Furthermore, since the width of the slit S2 at a part corresponding to the dummy layer DP is ensured to be large to a certain degree, it is possible to easily perform the process of removing the sacrificial layers 120 through the slit S2 and the process of forming the gate electrode layer 160.

In addition, since the width of the slit S2 at a part not corresponding to the dummy layer DP may be allowed to be small, it is also possible to reduce an area of the semiconductor device.

The semiconductor device and the method for fabricating the same of the aforementioned embodiments may be variously deformed.

For example, in the processes of FIG. 7A and FIG. 7B, the gate electrode layer 160 may be directly deposited instead of the sacrificial layers 120. In such an example, since the slit S2 is used only in order to separate the alternate stack structure of the interlayer dielectric layers 110 and the gate electrode layer 160, the processes of FIG. 11 and FIG. 12 may be omitted.

For example, in the processes of FIG. 8A and FIG. 8B, the process of forming the memory layer 140 may be omitted. That is, the channel layer 150 may also be filled in the entire channel hole CH2. In such an example, before the gate electrode layer 160 is filled in the groove G2 in the process of FIG. 12, the process of forming the memory layer 140 along an inner wall of the groove G2 may be firstly performed. This is because the memory layer 140 is interposed only between the channel layer 150 and the gate electrode layer 160.

The above and other memory circuits or semiconductor devices based on the various embodiments (i.e., those embodiments associated with FIGS. 7A-12) can be used in a range of devices or systems. FIGS. 13-17 provide some examples of devices or systems that can implement the memory circuits disclosed herein.

Figure 13:
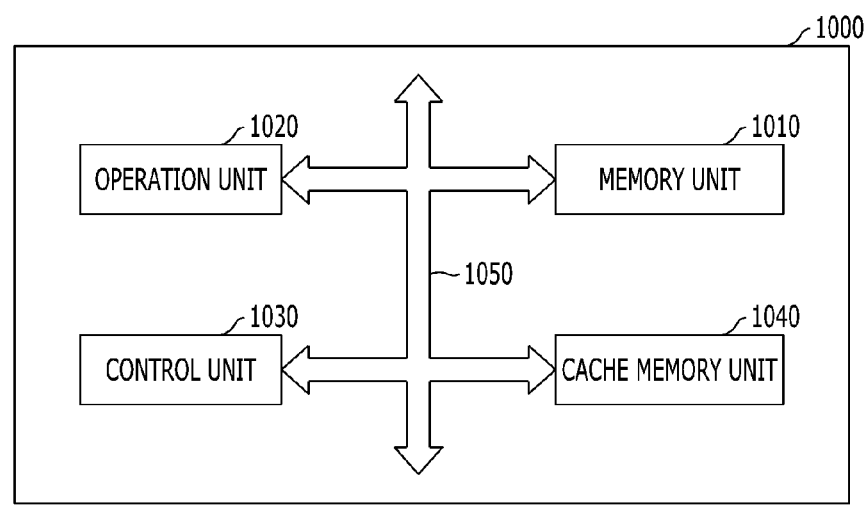
FIG. 13 is a representation of an example of configuration diagram of a microprocessor implementing memory circuitry based on an embodiment.

FIG. 13 is a representation of an example of configuration diagram of a microprocessor implementing memory circuitry based on an embodiment.

Referring to FIG. 13, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a plurality of channel layers extending in a vertical direction from a substrate; an interlayer dielectric layer and a gate electrode layer alternately stacked on the substrate along the channel layer; a memory layer interposed between the channel layer and the gate electrode layer; and a slit formed in a stack structure of the interlayer dielectric layer and the gate electrode layer and extending in a first direction, wherein the slit includes convex parts having a relatively large width of a second direction crossing the first direction and concave parts having a relatively small width of the second direction. Through this, in the memory unit 1010, uniformity of characteristics of memory cells may be secured, and reduction in size and simplification of processes may be possible. As a consequence, operating characteristics and degree of integration of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this example, the cache memory unit 1040 may exchange data with the memory unit 1010, the operation unit 1020 and the control unit 1030 through a bus interface 1050.

Figure 14:
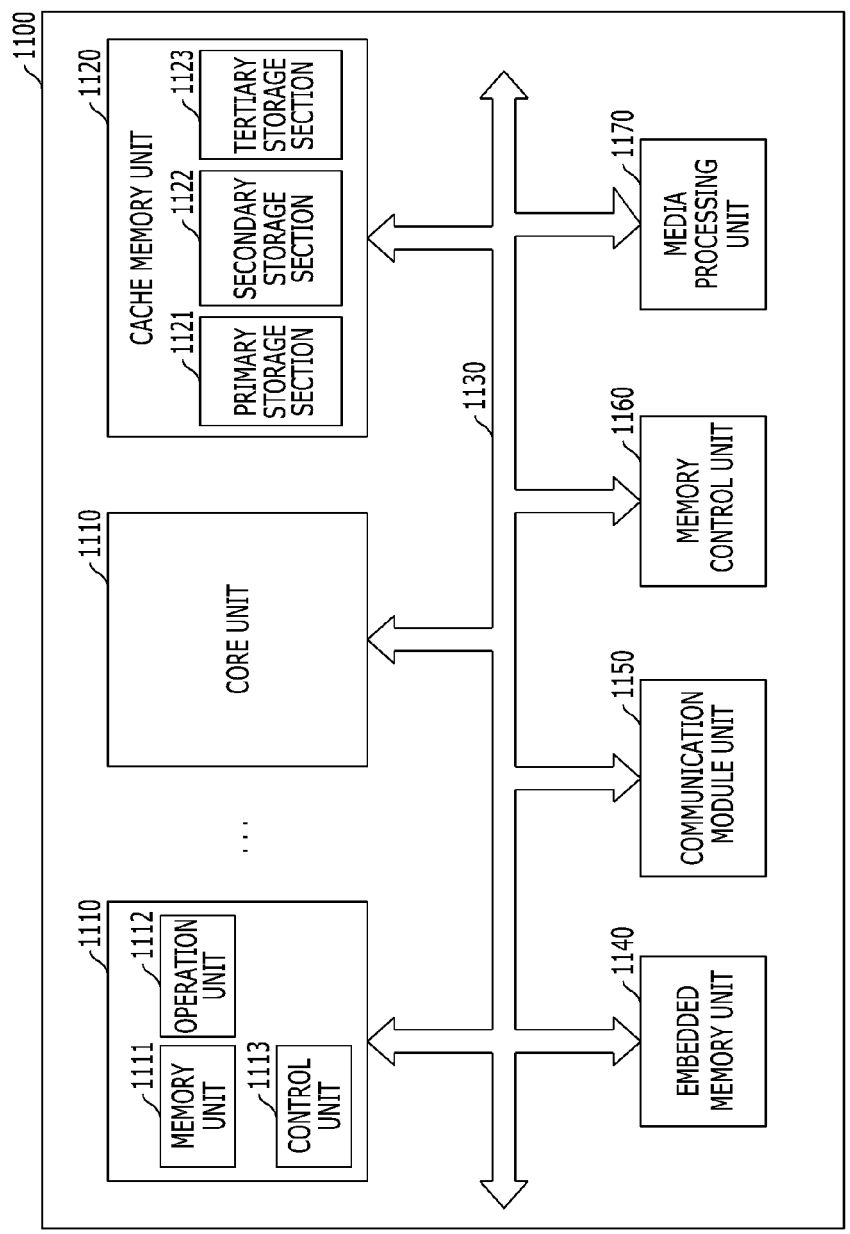
FIG. 14 is a representation of an example of configuration diagram of a processor implementing memory circuitry based on an embodiment.

FIG. 14 is a representation of an example of configuration diagram of a processor implementing memory circuitry based on an embodiment.

Referring to FIG. 14, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a plurality of channel layers extending in a vertical direction from a substrate; an interlayer dielectric layer and a gate electrode layer alternately stacked on the substrate along the channel layer; a memory layer interposed between the channel layer and the gate electrode layer; and a slit formed in a stack structure of the interlayer dielectric layer and the gate electrode layer and extending in a first direction, wherein the slit includes convex parts having a relatively large width of a second direction crossing the first direction and concave parts having a relatively small width of the second direction. Through this, in the cache memory unit 1120, uniformity of characteristics of memory cells may be secured, and reduction in size and simplification of processes may be possible. As a consequence, operating characteristics and degree of integration of the processor 1100 may be improved.

Although it was illustrated in FIG. 14 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. The primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In an implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to an implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this example, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 15:
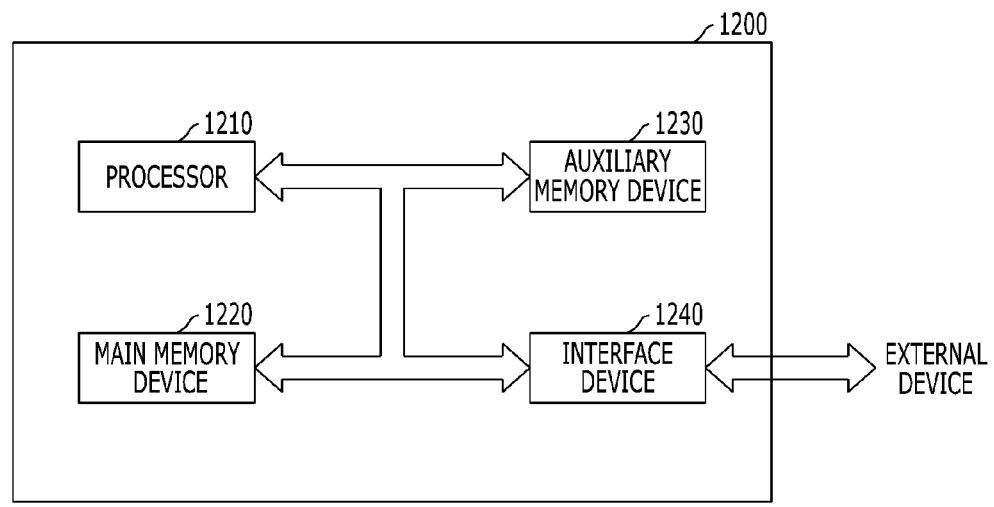
FIG. 15 is a representation of an example of configuration diagram of a system implementing memory circuitry based on an embodiment.

FIG. 15 is a representation of an example of configuration diagram of a system implementing memory circuitry based on an embodiment.

Referring to FIG. 15, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a plurality of channel layers extending in a vertical direction from a substrate; an interlayer dielectric layer and a gate electrode layer alternately stacked on the substrate along the channel layer; a memory layer interposed between the channel layer and the gate electrode layer; and a slit formed in a stack structure of the interlayer dielectric layer and the gate electrode layer and extending in a first direction, wherein the slit includes convex parts having a relatively large width of a second direction crossing the first direction and concave parts having a relatively small width of the second direction. Through this, in the main memory device 1220, uniformity of characteristics of memory cells may be secured, and reduction in size and simplification of processes may be possible. As a consequence, operating characteristics and degree of integration of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a plurality of channel layers extending in a vertical direction from a substrate; an interlayer dielectric layer and a gate electrode layer alternately stacked on the substrate along the channel layer; a memory layer interposed between the channel layer and the gate electrode layer; and a slit formed in a stack structure of the interlayer dielectric layer and the gate electrode layer and extending in a first direction, wherein the slit includes convex parts having a relatively large width of a second direction crossing the first direction and concave parts having a relatively small width of the second direction. Through this, in the auxiliary memory device 1230, uniformity of characteristics of memory cells may be secured, and reduction in size and simplification of processes may be possible. As a consequence, operating characteristics and degree of integration of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 16) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 16:
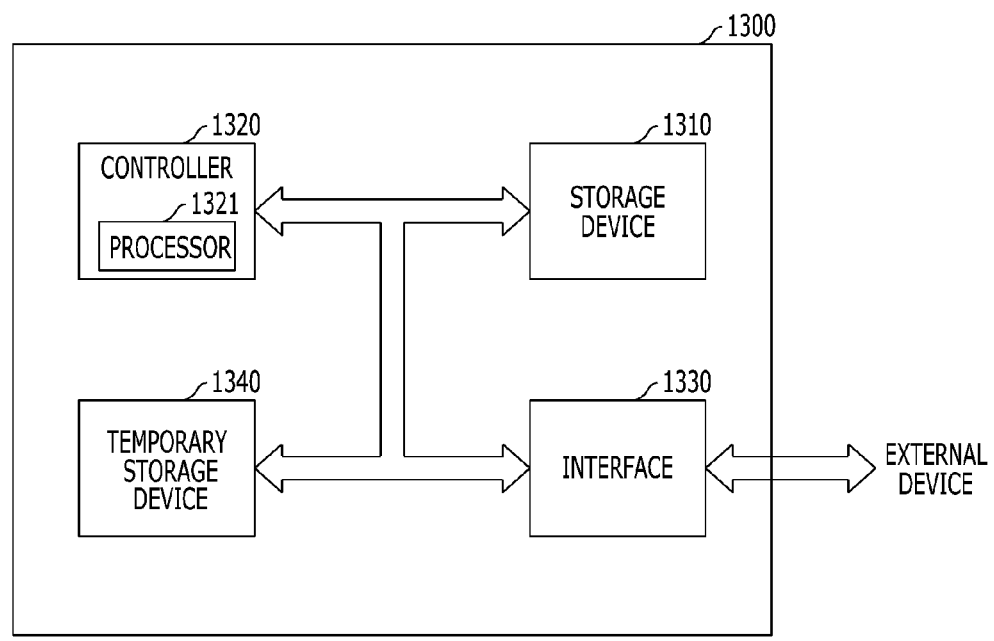
FIG. 16 is a representation of an example of configuration diagram of a data storage system implementing memory circuitry based on an embodiment.

FIG. 16 is a representation of an example of configuration diagram of a data storage system implementing memory circuitry based on an embodiment.

Referring to FIG. 16, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the example where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the example where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a plurality of channel layers extending in a vertical direction from a substrate; an interlayer dielectric layer and a gate electrode layer alternately stacked on the substrate along the channel layer; a memory layer interposed between the channel layer and the gate electrode layer; and a slit formed in a stack structure of the interlayer dielectric layer and the gate electrode layer and extending in a first direction, wherein the slit includes convex parts having a relatively large width of a second direction crossing the first direction and concave parts having a relatively small width of the second direction. Through this, in the storage device 1310 or the temporary storage device 1340, uniformity of characteristics of memory cells may be secured, and reduction in size and simplification of processes may be possible. As a consequence, operating characteristics and degree of integration of the data storage system 1300 may be improved.

Figure 17:
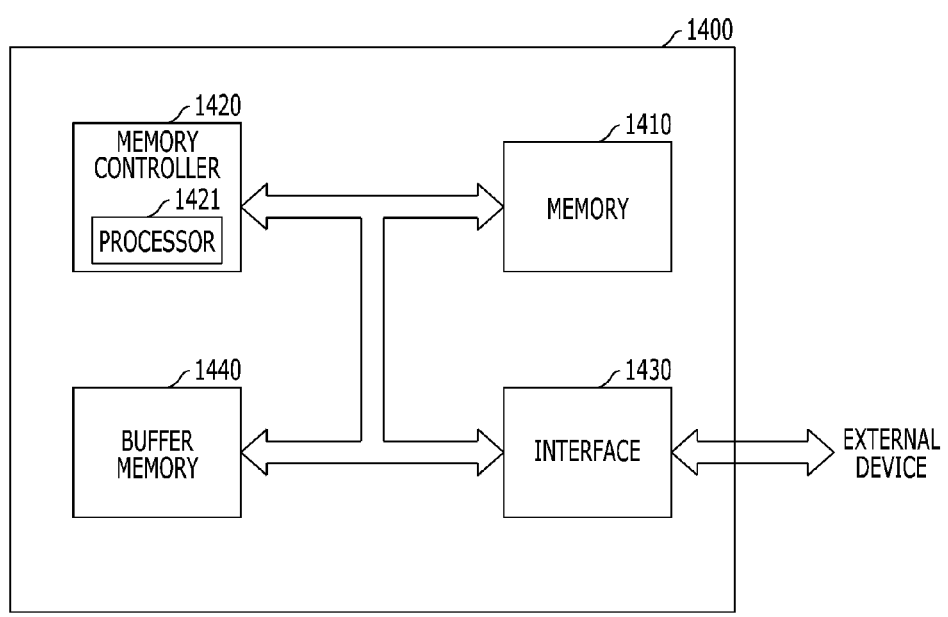
FIG. 17 is a representation of an example of configuration diagram of a memory system implementing memory circuitry based on an embodiment.

FIG. 17 is a representation of an example of configuration diagram of a memory system implementing memory circuitry based on an embodiment.

Referring to FIG. 17, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a plurality of channel layers extending in a vertical direction from a substrate; an interlayer dielectric layer and a gate electrode layer alternately stacked on the substrate along the channel layer; a memory layer interposed between the channel layer and the gate electrode layer; and a slit formed in a stack structure of the interlayer dielectric layer and the gate electrode layer and extending in a first direction, wherein the slit includes convex parts having a relatively large width of a second direction crossing the first direction and concave parts having a relatively small width of the second direction. Through this, in the memory 1410, uniformity of characteristics of memory cells may be secured, and reduction in size and simplification of processes may be possible. As a consequence, operating characteristics and degree of integration of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a plurality of channel layers extending in a vertical direction from a substrate; an interlayer dielectric layer and a gate electrode layer alternately stacked on the substrate along the channel layer; a memory layer interposed between the channel layer and the gate electrode layer; and a slit formed in a stack structure of the interlayer dielectric layer and the gate electrode layer and extending in a first direction, wherein the slit includes convex parts having a relatively large width of a second direction crossing the first direction and concave parts having a relatively small width of the second direction. Through this, in the buffer memory 1440, uniformity of characteristics of memory cells may be secured, and reduction in size and simplification of processes may be possible. As a consequence, operating characteristics and degree of integration of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 13-17 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this disclosure contains many specifics, these should not be construed as limitations on the scope of the embodiments or of what may be claimed, but rather as descriptions of features that may be specific to particular embodiments. Certain features that are described in this disclosure in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this disclosure should not be understood as requiring such separation in all embodiments.

Only a few implementations and examples are described. Other implementations, enhancements and variations can be made based on what is described and illustrated in this disclosure.

What is claimed is:

1. A method for fabricating an electronic device including a semiconductor memory, comprising:
    forming a stack structure in which an interlayer dielectric layer and a material layer are alternately stacked on a substrate;
    forming a plurality of holes arranged to have a substantially constant interval while exposing the substrate by passing through the stack structure;
    forming a channel layer in a first hole of the plurality of holes;
    forming a dummy layer in a second hole of the plurality of holes;
    forming a mask pattern on a resultant structure including the dummy layer and the channel layer to expose an area extending in a first direction while overlapping the dummy layer arranged in the first direction; and
    forming a slit by etching the stack structure using the mask pattern as an etching barrier and removing the dummy layer.

2. The method of claim 1, wherein, in a second direction crossing the first direction, a width of the area exposed by the mask pattern is smaller than a width of the dummy layer.

3. The method of claim 1, wherein the slit includes convex parts having a relatively larger width in the second direction than concave parts having a relatively smaller width in the second direction.

4. The method of claim 3, wherein the convex parts and the concave parts are alternately arranged along the first direction.

5. The method of claim 1, wherein the plurality of holes are arranged to be positioned on a substantially straight line in the first direction, and are not positioned on the straight line and cross one another in the second direction.

6. The method of claim 5, wherein the slit includes convex parts having a relatively larger width in the second direction than concave parts having a relatively smaller width in the second direction,
    the concave parts are formed at positions respectively corresponding to a plurality of channel layers adjacent to the slit, and
    the convex parts are formed at positions respectively corresponding to areas between the plurality of channel layers adjacent to the slit.

7. The method of claim 1, wherein the dummy layer is formed of a material substantially equal to the interlayer dielectric layer or the material layer.

8. The method of claim 7, wherein the etching of the stack structure and the removal of the dummy layer are simultaneously performed.

9. The method of claim 1, wherein the etching of the stack structure for forming the slit and removal of the mask pattern are simultaneously performed.

10. The method of claim 7, wherein the etching of the stack structure, the removal of the dummy layer, and removal of the mask pattern are simultaneously performed.

11. The method of claim 1, further comprising:
    forming a memory layer interposed between the channel layer and the material layer.

12. The method of claim 1, further comprising, after the forming of the slit:
    removing the material layer; and
    filling a space, from which the material layer has been removed, with a conductive material.

13. The method of claim 1, further comprising, after the forming of the slit:
    forming a groove by removing the material layer; and
    forming a metal layer along an inner surface of the groove.

14. The method of claim 13, further comprising:
    filling a remaining space of the groove with another metal layer,
    wherein the metal layer is configured as a diffusion barrier.

15. The method of claim 1, wherein the material layer includes a conductive material.

16. An electronic device including a semiconductor memory, wherein the semiconductor memory comprises:
    a plurality of channel layers extending in a vertical direction from a substrate;
    an interlayer dielectric layer and a gate electrode layer alternately stacked on the substrate along the channel layer;

a memory layer interposed between the channel layer and the gate electrode layer; and a slit formed in a stack structure of the interlayer dielectric layer and the gate electrode layer and extending in a first direction, wherein the slit includes first convex parts mirrored with second convex parts located across from the first convex parts, respectively, and wherein the slit includes first concave parts mirrored with second concave parts located across from the second concave parts, respectively.

17. The electronic device of claim 16, wherein a distance between the first convex parts and second convex parts is greater than a distance between the first concave parts and second concave parts.

18. The electronic device of claim 16, further comprising:
a convex part including the first convex part and the second convex part;
a concave part including the first concave part and the second concave part,
wherein a plurality of the convex parts and a plurality of the concave parts are alternately arranged along the first direction.

19. An electronic device including a semiconductor memory, wherein the semiconductor memory comprises:
a plurality of channel layers extending in a vertical direction from a substrate;
an interlayer dielectric layer and a gate electrode layer alternately stacked on the substrate along the channel layer;
a memory layer interposed between the channel layer and the gate electrode layer; and
a slit formed in a stack structure of the interlayer dielectric layer and the gate electrode layer and extending in a first direction,
wherein the slit includes convex parts having a relatively larger width in a second direction crossing the first direction than concave parts having a relatively smaller width in the second direction.

20. The electronic device of claim 19, wherein the convex parts and the concave parts are alternately arranged along the first direction.

21. The electronic device of claim 19, wherein the plurality of channel layers are arranged to be positioned on a substantially straight line in the first direction, and are not positioned on the straight line and cross one another in the second direction.

22. The electronic device of claim 21, wherein the concave parts are formed at positions respectively corresponding to the plurality of channel layers adjacent to the slit, and the convex parts are formed at positions respectively corresponding to areas between the plurality of channel layers adjacent to the slit.

23. The electronic device according to claim 19, further comprising a microprocessor which includes:
a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory is part of the memory unit in the microprocessor.

24. The electronic device according to claim 19, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface coupled between the core unit and the cache memory unit, and configured to transmit data between the core unit and the cache memory unit,
wherein the semiconductor memory is part of the cache memory unit in the processor.

25. The electronic device according to claim 19, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and a command inputted externally from the interface device,
wherein the semiconductor memory is part of the auxiliary memory device or the main memory device in the processing system.

26. The electronic device according to claim 19, further comprising a data storage system which includes:
a storage device configured to store data and conserve stored data regardless of power supply;
a controller configured to control input and output of data to and from the storage device according to a command inputted externally from the controller;
a temporary storage device configured to temporarily store data exchanged between the storage device and the outside; and
an interface configured to perform communication between at least one of the storage device, the controller and the temporary storage device and the command inputted externally from the controller,
wherein the semiconductor memory is part of the storage device or the temporary storage device in the data storage system.

27. The electronic device according to claim 19, further comprising a memory system which includes:
a memory configured to store data and conserve stored data regardless of power supply;
a memory controller configured to control input and output of data to and from the memory according to a command inputted externally from the memory controller;
a buffer memory configured to buffer data exchanged between the memory and the outside; and
an interface configured to perform communication between at least one of the memory, the memory controller and the buffer memory and the command inputted externally from the memory controller, wherein the semiconductor memory is part of the memory or the buffer memory in the memory system.

* * * * *